(12) United States Patent
Chang et al.

(10) Patent No.: US 10,868,002 B2
(45) Date of Patent: Dec. 15, 2020

(54) SEMICONDUCTOR STRUCTURE AND MANUFACTURING METHOD THEREOF

(71) Applicant: TAIWAN SEMICONDUCTOR MANUFACTURING COMPANY LIMITED, Hsin-Chu (TW)

(72) Inventors: Che-Cheng Chang, New Taipei (TW); Chih-Han Lin, Hsinchu (TW); Horng-Huei Tseng, HsinChu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/390,229

(22) Filed: Apr. 22, 2019

(65) Prior Publication Data
US 2019/0244957 A1 Aug. 8, 2019

Related U.S. Application Data

(60) Continuation of application No. 15/790,129, filed on Oct. 23, 2017, now Pat. No. 10,269,795, which is a
(Continued)

(51) Int. Cl.
*H01L 27/088* (2006.01)
*H01L 21/768* (2006.01)
*H01L 21/8234* (2006.01)
*H01L 21/8238* (2006.01)
*H01L 23/535* (2006.01)
(Continued)

(52) U.S. Cl.
CPC .... *H01L 27/0886* (2013.01); *H01L 21/76802* (2013.01); *H01L 21/76834* (2013.01); *H01L 21/76837* (2013.01); *H01L 21/76897* (2013.01); *H01L 21/823468* (2013.01); *H01L 21/823475* (2013.01); *H01L 21/823864* (2013.01); *H01L 21/823871* (2013.01); *H01L 23/535* (2013.01); *H01L 27/088* (2013.01); *H01L 29/41775* (2013.01); *H01L 29/41791* (2013.01);
(Continued)

(58) Field of Classification Search
None
See application file for complete search history.

(56) References Cited

U.S. PATENT DOCUMENTS 5,069,747 A 12/1991 Cathey et al.
5,643,833 A 7/1997 Tsukamoto
(Continued)

*Primary Examiner* — Erik Kielin
(74) *Attorney, Agent, or Firm* — Cooper Legal Group, LLC

(57) ABSTRACT

A semiconductor structure includes a substrate, a first gate structure, a first spacer, a source/drain structure, a conductor, and a contact etch stop layer. The first gate structure is present on the substrate. The first spacer is present on at least one sidewall of the first gate structure, in which the first spacer has a top portion and a bottom portion between the top portion and the substrate. The source/drain structure is present adjacent to the bottom portion of the first spacer. The conductor is electrically connected to the source/drain structure. The protection layer is present at least between the conductor and the top portion of the first spacer. The contact etch stop layer is present at least partially between the conductor and the bottom portion of the first spacer while absent between the protection layer and the top portion of the first spacer.

20 Claims, 10 Drawing Sheets

Related U.S. Application Data division of application No. 15/074,986, filed on Mar. 18, 2016, now Pat. No. 9,799,651.

(60) Provisional application No. 62/269,851, filed on Dec. 18, 2015.

(51) Int. Cl.
*H01L 29/417* (2006.01)
*H01L 29/66* (2006.01)
*H01L 29/78* (2006.01)

(52) U.S. Cl.
CPC ......... *H01L 29/66795* (2013.01); *H01L 21/823425* (2013.01); *H01L 2029/7858* (2013.01)

(56) References Cited

U.S. PATENT DOCUMENTS

| | | | |
|---|---|---|---|
| 6,025,255 A * | 2/2000 | Chen | H01L 21/31116 257/E21.252 |
| 6,218,275 B1 * | 4/2001 | Huang | H01L 21/76897 257/E21.507 |
| 9,349,833 B1 | 5/2016 | Hung et al. | |
| 2008/0230917 A1 | 9/2008 | Chou et al. | |
| 2013/0175629 A1 | 7/2013 | Chang | |
| 2015/0069473 A1 | 3/2015 | Glass et al. | |
| 2015/0228776 A1 | 8/2015 | Xie | |
| 2016/0284806 A1 * | 9/2016 | Park | H01L 29/41791 |

* cited by examiner

SEMICONDUCTOR STRUCTURE AND MANUFACTURING METHOD THEREOF

PRIORITY CLAIM AND CROSS-REFERENCE

This application is a continuation of and claims priority to U.S. Non-Provisional application Ser. No. 15/790,129, titled "Semiconductor Structure and Manufacturing Method Thereof" and filed on Oct. 23, 2017, which is a divisional of and claims priority to U.S. Non-Provisional application Ser. No. 15/074,986, now U.S. Pat. No. 9,799,651, titled "Semiconductor Structure and Manufacturing Method Thereof" and filed on Mar. 18, 2016, which claims priority to U.S. Provisional Application Ser. No. 62/269,851, titled "Finfet Structure and Method for Manufacturing the Same" and filed on Dec. 18, 2015. U.S. Non-Provisional application Ser. Nos. 15/790,129 and 15/074,986 and U.S. Provisional Application Ser. No. 62/269,851 are incorporated herein by reference.

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area.

The word "interconnection" in integrated circuits means conductive lines which connect the various electronic components. The interconnecting conductive lines are separated from the substrate by insulating layers, except on the contact area. As feature densities increase, the widths of the conductive lines and the spacing between the conductive lines of interconnect structures also scale smaller.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
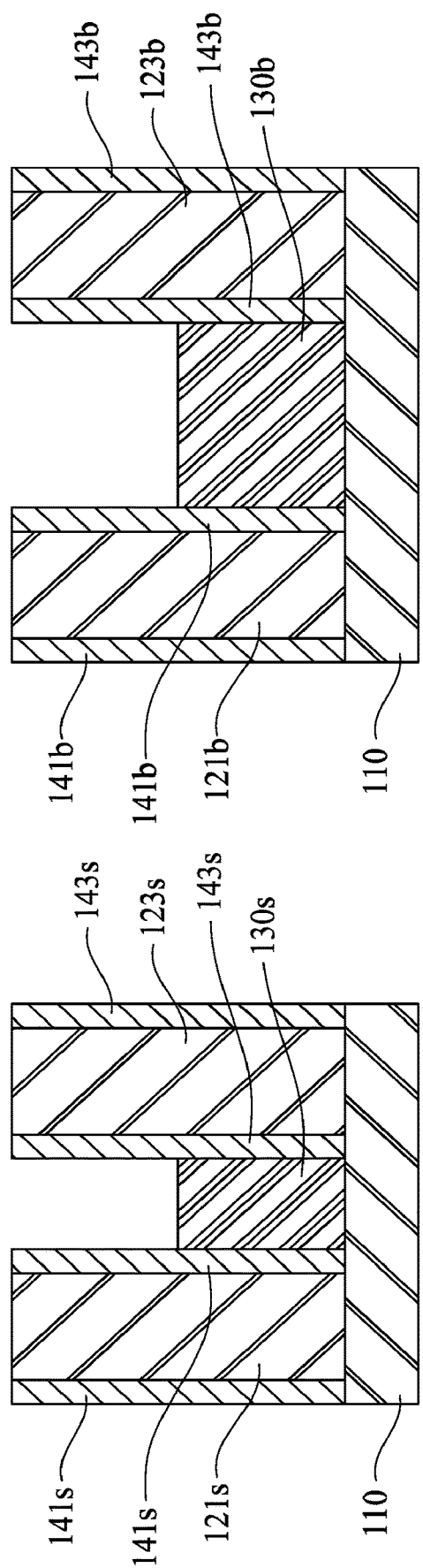
FIGS. 1-10 are cross-sectional views of a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a", "an" and "the" are intended to include the plural forms as well, unless the context clearly indicates otherwise. It will be further understood that the terms "comprises" and/or "comprising", or "includes" and/ or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by the person having ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1-10 are cross-sectional views of a method for manufacturing a semiconductor structure at various stages in accordance with some embodiments of the present disclosure.

Reference is made to FIG. 1. A semiconductor structure is formed. The semiconductor structure includes a substrate 110, gate structures 121s, 121b, 123s, and 123b, and source/ drain structures 130s and 130b. The gate structures 121s, 121b, 123s, and 123b are present on the substrate 110. The source/drain structure 130s is present on the substrate 110 and adjacent to the gate structures 121s and 123s, and the source/drain structure 130b is present on the substrate 110 and adjacent to the gate structures 121b and 123b. In other words, the source/drain structure 130s is present between the gate structures 121s and 123s, and the source/drain structure 130b is present between the gate structures 121b and 123b. It is note that the numbers of the gate structures 121s, 121b, 123s, and 123b and the number of the source/drain structures 130s and 130b are illustrative and should not limit various embodiments of the present disclosure. The numbers of the gate structures 121s, 121b, 123s, and 123b and the source/ drain structures 130s, and 130b may vary according to actual situations.

Specifically, the source/drain structure 130s is narrower than the source/drain structure 130b. That is, the gate structures 121s and 123s and the source/drain structure 130s belong to at least one semiconductor device having at least one narrower source/drain contact, and the gate structures 121b and 123b and the source/drain structure 130b belong to at least one semiconductor device having at least one wider source/drain contact.

In some embodiments, the substrate 110 may be made of a semiconductor material and may include, for example, a graded layer or a buried oxide therein. In some embodiments, the substrate 110 includes bulk silicon that may be undoped or doped (e.g., p-type, n-type, or combinations thereof). Other materials that are suitable for semiconductor device formation may be used. For example, germanium, quartz, sapphire, and glass could alternatively be used for the substrate 110. Alternatively, the substrate 110 may be an active layer of a semiconductor-on-insulator (SOI) substrate or a multi-layered structure, such as a silicon-germanium layer formed on a bulk silicon layer.

In some embodiments, at least one stack of a gate dielectric layer, a diffusion barrier layer, a metal layer, a block layer, a wetting layer, and filling metal form at least one of the gate structures 121s, 121b, 123s, and 123b. In other words, at least one of the gate structures 121s, 121b, 123s, and 123b may include the stack of the gate dielectric layer, the diffusion barrier layer, the metal layer, the block layer, the wetting layer, and the filling metal.

In some embodiments, the gate dielectric layer includes an interfacial layer (IL, the lower part of the gate dielectric layer), which is a dielectric layer. In some embodiments, the IL includes an oxide layer, such as a silicon oxide layer, which may be formed through thermal oxidation of the substrate 110, chemical oxidation of the substrate 110, or a deposition step. The gate dielectric layer may also include a high-k dielectric layer (the upper part of the gate dielectric layer) including a high-k dielectric material, such as hafnium oxide, lanthanum oxide, aluminum oxide, or combinations thereof. The dielectric constant (k-value) of the high-k dielectric material is higher than about 3.9, and may be higher than about 7, and sometimes as high as about 21 or higher. The high-k dielectric layer is overlying, and may contact, the IL.

In some embodiments, the diffusion barrier layer includes TiN, TaN, or combinations thereof. For example, the diffusion barrier layer may include a TiN layer (the lower part of the diffusion barrier layer) and a TaN layer (the upper part of the diffusion barrier layer) over the TiN layer.

When one of the gate structures 121s, 121b, 123s, and 123b forms an n-type metal-oxide-semiconductor (MOS) device, the metal layer is in contact with the diffusion barrier layer. For example, in the embodiments in which the diffusion barrier layer includes a TiN layer and a TaN layer, the metal layer may be in physical contact with the TaN layer. In alternative embodiments in which one of the gate structures 121s, 121b, 123s, and 123b forms a p-type MOS device, an additional TiN layer is formed between, and in contact with, the TaN layer (in the diffusion barrier layer) and the overlaying metal layer. The additional TiN layer provides the work function suitable for the pMOS device, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

The metal layer provides the work function suitable for the nMOS device, which work function is lower than the mid-gap work function. The work function lower than the mid-gap work function is referred to as an n-work function, and the respective metal having the n-work function may be referred to as an n-metal. In some embodiments, the metal layer is an n-metal having a work function lower than about 4.3 eV. The work function of the metal layer may also be in a range from about 3.8 eV to about 4.6 eV. The metal layer may include titanium aluminum (TiAl) (which may include, or free from or substantially free from other elements) in accordance with some embodiments. The formation of the metal layer may be achieved through physical vapor deposition (PVD). In accordance with some embodiments of the present disclosure, the metal layer is formed at room temperature (for example, from about 20° C. to about 25° C.). In alternative embodiments, the metal layer is formed at an elevated temperature higher than the room temperature, for example, higher than about 200° C.

The block layer may include TiN in some embodiments. The block layer may be formed using atomic layer deposition (ALD).

The wetting layer has an ability to adhere (and wet) the subsequently formed filling metal during the reflow of the filling metal. In some embodiments, the wetting layer is a cobalt layer, which may be formed using atomic layer deposition (ALD) or chemical vapor deposition (CVD).

The filling metal may include aluminum, an aluminum alloy (e.g., titanium aluminum), tungsten, or copper, which may also be formed using physical vapor deposition (PVD), chemical vapor deposition (CVD), or the like. The filling metal may be reflowed. The formation of the wetting layer improves the wetting of the filling metal to the underlying layers.

The source/drain structures 130s and 130b may be formed by doping impurities into active semiconductor fins, which are formed by, for example, patterning and etching the substrate 110 using photolithography techniques. In some embodiments that the resulting MOS devices are nMOS devices, n-type impurities such as phosphorous or arsenic may be doped in the source/drain structures 130s and 130b. In some other embodiments that the resulting MOS devices are pMOS devices, p-type impurities such as boron or $BF_2$ may be doped in the source/drain structures 130s and 130b.

Alternatively, the source/drain structures 130s and 130b may be formed by, for example, epitaxial growth. In these embodiments, the source/drain structures 130s and 130b may function as source/drain stressors to enhance carrier mobility of the semiconductor devices and the device performance. The source/drain structures 130s and 130b may be formed using a cyclic deposition and etching (CDE) process. The CDE process includes an epitaxial deposition/partial etch process and repeating the epitaxial deposition/partial etch process at least once.

In some embodiments that the resulting MOS devices are nMOS devices, the source/drain structures 130s and 130b may be n-type epitaxy structures. In some embodiments that the resulting MOS devices are pMOS devices, the source/drain structures 130s and 130b may be p-type epitaxy structures. The n-type epitaxy structures may be made of SiP, SiC, SiPC, Si, III-V compound semiconductor materials or combinations thereof, and the p-type epitaxy structures may be made of SiGe, SiGeC, Ge, Si, III-V compound semiconductor materials, or combinations thereof. During the formation of the n-type epitaxy structures, n-type impurities such as phosphorous or arsenic may be doped with the proceeding of the epitaxy. For example, when the n-type epitaxy structures include SiP or SiC, n-type impurities are doped. Moreover, during the formation of the p-type epitaxy structures, p-type impurities such as boron or $BF_2$ may be doped with the proceeding of the epitaxy. For example, when the p-type epitaxy structures include SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The source/drain structures 130s and 130b may be in-situ doped. If the source/drain structures 130s and 130b are not in-situ doped, a second implantation process (i.e., a junction implant process) is performed to dope the source/drain structures 130s and 130b. One or more annealing processes may be performed to activate the source/drain structures 130s and 130b. The annealing processes include rapid thermal annealing (RTA) and/or laser annealing processes.

In addition, spacers 141s are present on sidewalls of the gate structure 121s, spacers 143s are present on sidewalls of the gate structure 123s, spacers 141b are present on sidewalls of the gate structure 121b, and spacers 143b are present on sidewalls of the gate structure 123b. In some embodiments, at least one of the spacers 141s, 141b, 143s, and 143b include one or more layers, including silicon nitride, silicon oxynitride, silicon oxide, or other dielectric materials. The available formation methods include plasma enhanced chemical vapor deposition (PECVD), low-pressure chemical vapor deposition (LPCVD), sub-atmospheric chemical vapor deposition (SACVD), and other deposition methods.

Figure 2:
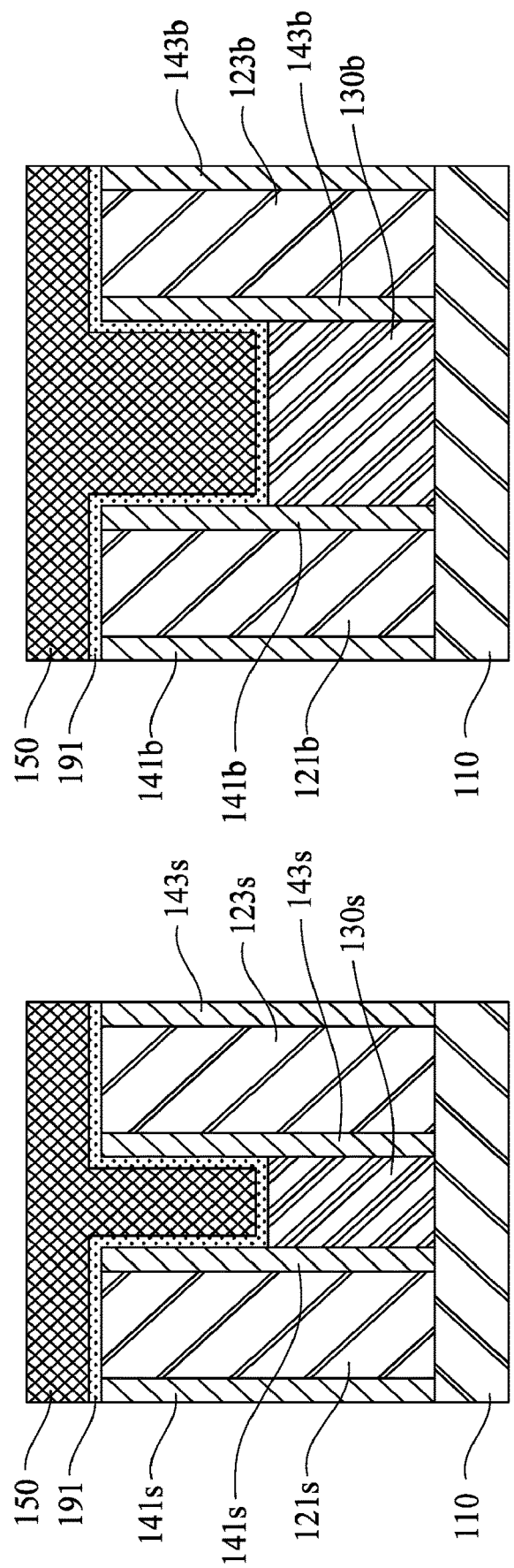

Reference is made to FIG. 2. A contact etch stop layer (CESL) 191 is formed on the top surfaces of the gate structures 121s, 121b, 123s, and 123b, the spacers 141s, 141b, 143s, and 143b, and the source/drain structures 130s, and 130b and the side surfaces of the spacers 141s, 141b, 143s, and 143b. The CESL 191 may include, for example, silicon nitride or the like. The CESL 191 may be formed using chemical vapor deposition (CVD), physical vapor deposition (PVD), atomic layer deposition (ALD), other suitable processes, or combinations thereof.

Then, a dielectric layer 150 is formed on the CESL 191. At least a portion of the dielectric layer 150 is present between the spacers 141s and 143s and on the source/drain structure 130s, and at least a portion of the dielectric layer 150 is present between the spacers 141b and 143b and on the source/drain structure 130b. The dielectric layer 150 is an interlayer dielectric (ILD) layer. The dielectric layer 150 is made of a dielectric material, such as silicon oxide, silicon nitride, silicon oxynitride, or combinations thereof. In some embodiments, the dielectric layer 150 is made of a low-κ dielectric material to improve resistive-capacitive (RC) delay. The dielectric constant of the low-κ dielectric material is lower than that of silicon dioxide ($SiO_2$). One approach to reduce the dielectric constant of a dielectric material is to introduce carbon (C) or fluorine (F) atoms. For example, in $SiO_2$ (κ=3.9), the introduction of C atoms to form hydrogenated carbon-doped silicon oxide (SiCOH) (κ is between 2.7 and 3.3) and the introduction of F atoms to form fluorosilicate glass (FSG) (κ is between 3.5 and 3.9) reduces its dielectric constant. In some embodiments, the low-κ dielectric material is, for example, nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The dielectric layer 150 is formed by, for example, chemical vapor deposition (CVD), spin coating, or combinations thereof.

Figure 3:
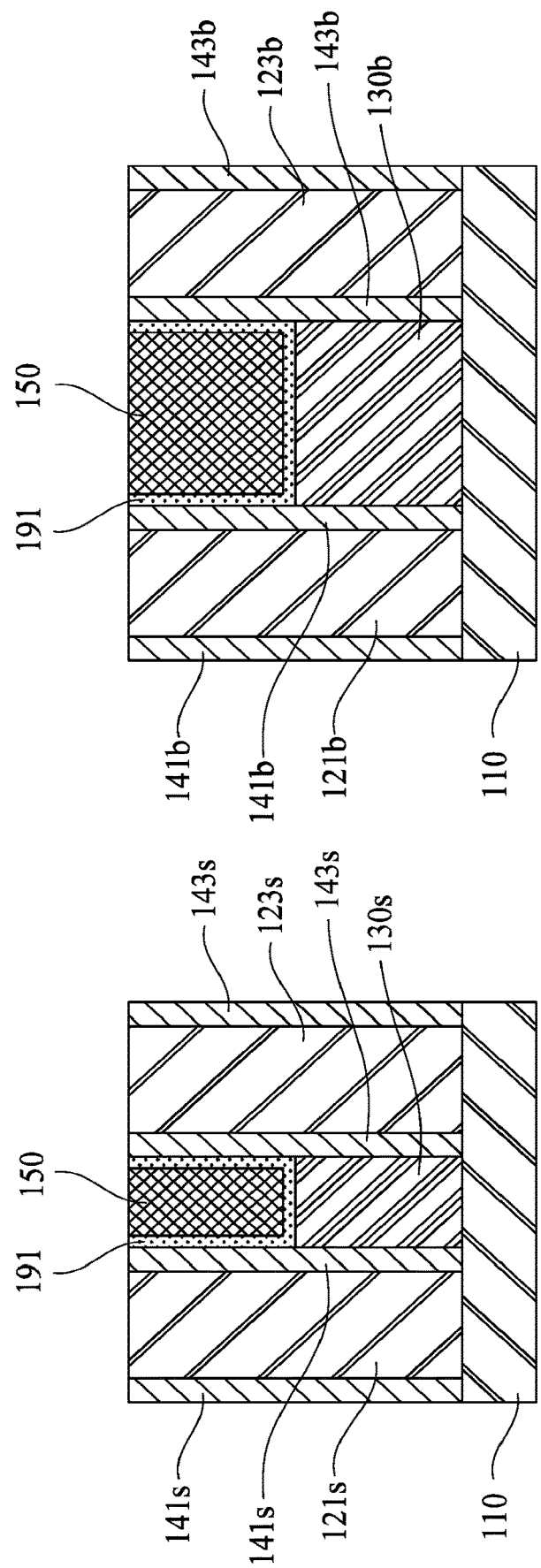

As shown in FIG. 2 and FIG. 3, the CESL 191 and the dielectric layer 150 above the gate structures 121s, 121b, 123s, and 123b are removed through a removal process. In some embodiments, the CESL 191 and the dielectric layer 150 above the gate structures 121s, 121b, 123s, and 123b are removed by a chemical mechanical polishing (CMP) process. After the CMP process, a portion of the residual dielectric layer 150 is present on the source/drain structure 130s and between the gate structures 121s and 123s, and a portion of the residual dielectric layer 150 is present on the source/drain structure 130b and between the gate structures 121b and 123b. A portion of the residual CESL 191 is present between the portion of the dielectric layer 150 on the source/drain structure 130s and the spacer 141s, between the portion of the dielectric layer 150 on the source/drain structure 130s and the spacer 143s, and between the portion of the dielectric layer 150 on the source/drain structure 130s and the source/drain structure 130s. A portion of the residual CESL 191 is present between the portion of the dielectric layer 150 on the source/drain structure 130b and the spacer 141b, between the portion of the dielectric layer 150 on the source/drain structure 130b and the spacer 143b, and between the portion of the dielectric layer 150 on the source/drain structure 130b and the source/drain structure 130b.

Figure 4:
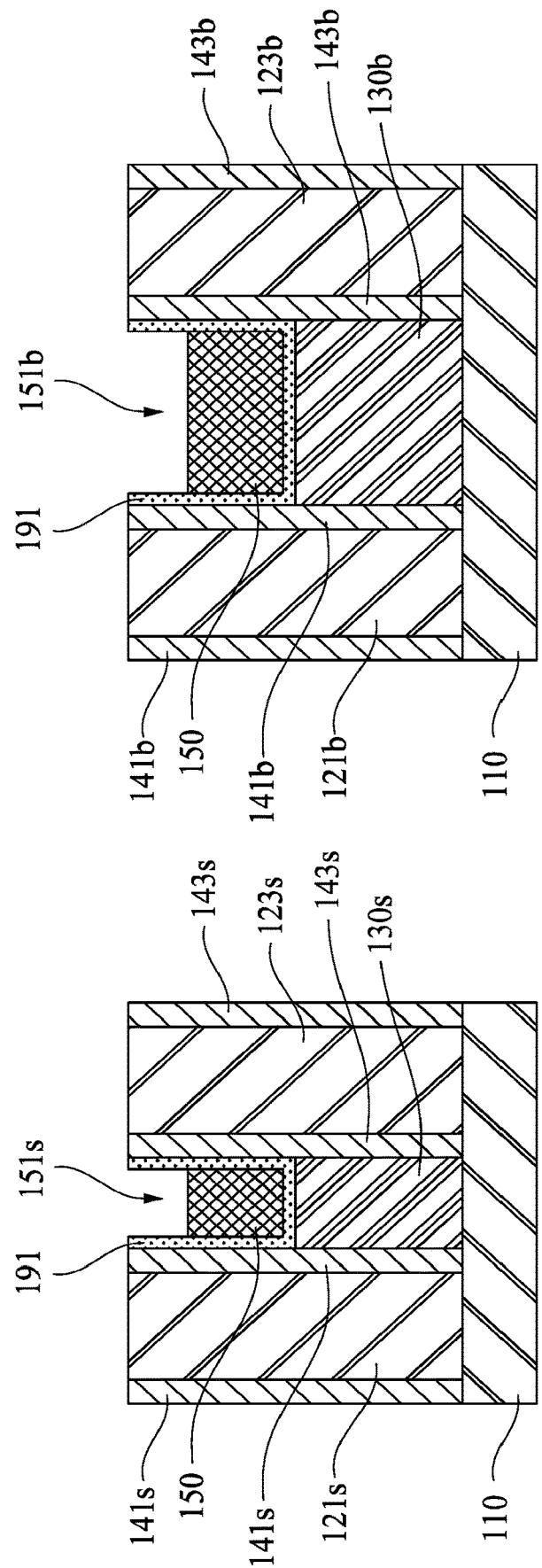

Reference is made to FIG. 4. Upper portions of the residual dielectric layer 150 are removed, such that the portion of the dielectric layer 150 and the portion of the CESL 191 on the source/drain structure 130s form a recess 151s, and the portion of the dielectric layer 150 and the portion of the CESL 191 on the source/drain structure 130b form a recess 151b. At least portions of the CESL 191 are exposed by the recesses 151s and 151b. The upper portions of the residual dielectric layer 150 are removed by etching. The etching of the dielectric layer 150 may be dry etching, such as reactive ion etching (RIE), plasma enhanced (PE) etching, or inductively coupled plasma (ICP) etching. In some embodiments, when the dielectric layer 150 is made of silicon oxide, fluorine-based RIE can be used to form the recesses 151s and 151b. The gas etchant used to dry etch the dielectric layer 150 is, for example, $CF_4/O_2$.

Figure 5:
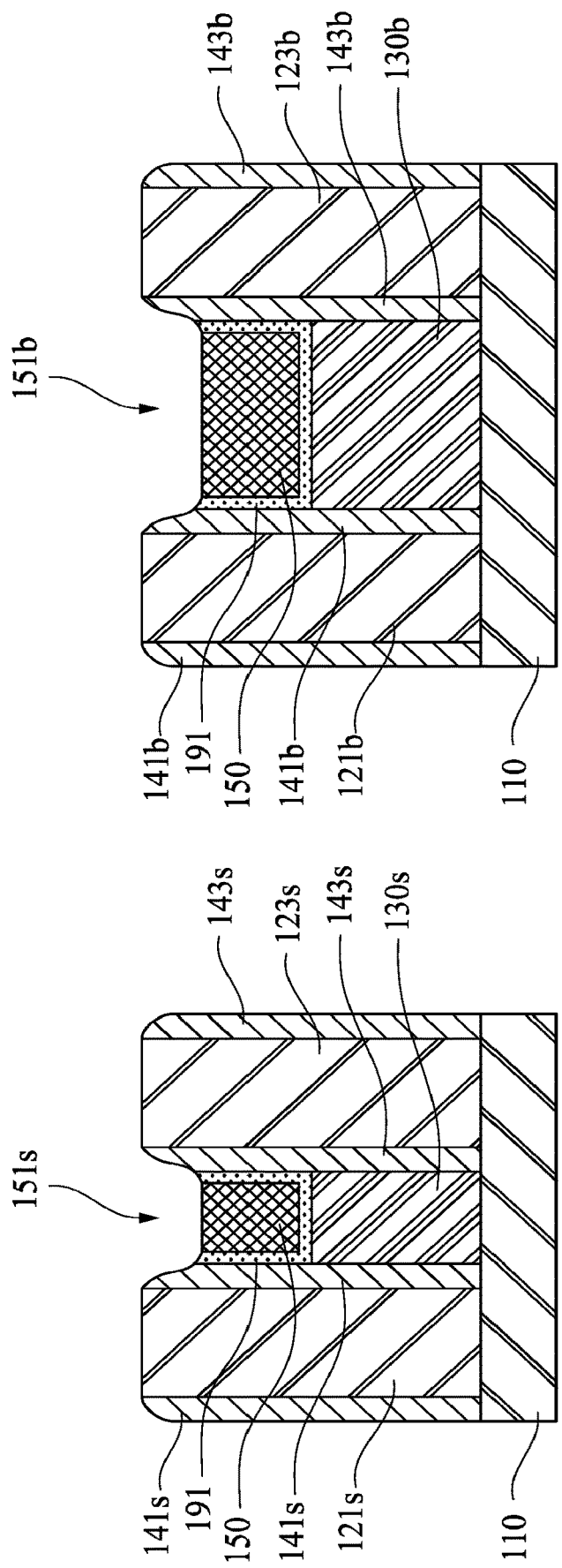

Reference is made to FIG. 5. Upper portions of the CESL 191 are removed. Top portions of the spacers 141s and 143s adjacent to the recess 151s are rounded to be rounded top corners, and top portions of the spacers 141b and 143b adjacent to the recess 151b are rounded to be rounded top corners. Specifically, the removing and the corner rounding are performed by trimming. More specifically, the trimming may be dry etching, such as reactive ion etching (RIE), plasma enhanced (PE) etching, or inductively coupled plasma (ICP) etching, or selective wet etching, which is a chemical etching process. A wet etching solution may include a hot phosphoric acid solution.

Figure 6:
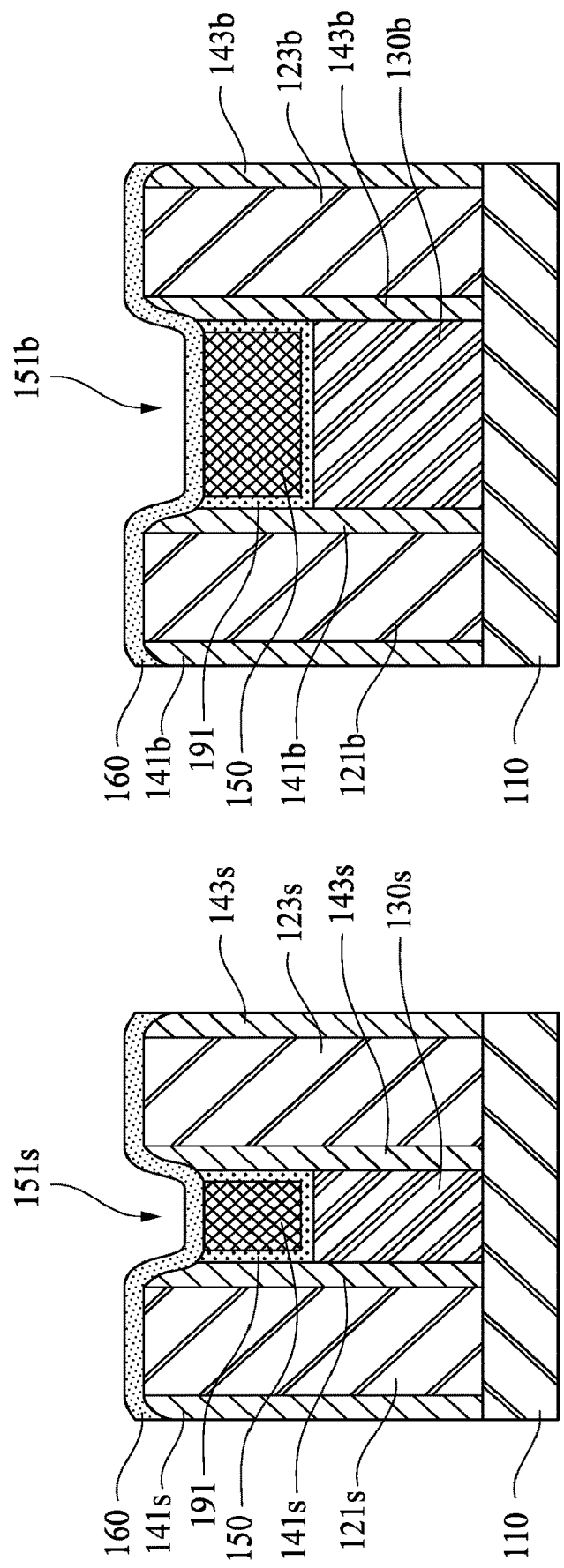

Reference is made to FIG. 6. A protection layer 160 is formed on the top surfaces of the gate structures 121s, 121b, 123s, and 123b, sidewalls of the recesses 151s and 151b (i.e., the rounded top corners of the spacers 141s, 141b, 143s, and 143b and the exposed CESL 191), and bottom surfaces of the recesses 151s and 151b (i.e., top surfaces of the portion of the dielectric layer 150 on the source/drain structure 130s and the portion of the dielectric layer 150 on the source/drain structure 130b). The protection layer 160 may include, for example, silicon nitride, silicon oxynitride, or the like. The protection layer 160 may be formed using atomic layer deposition (ALD), other suitable processes, or combinations thereof.

Figure 7:
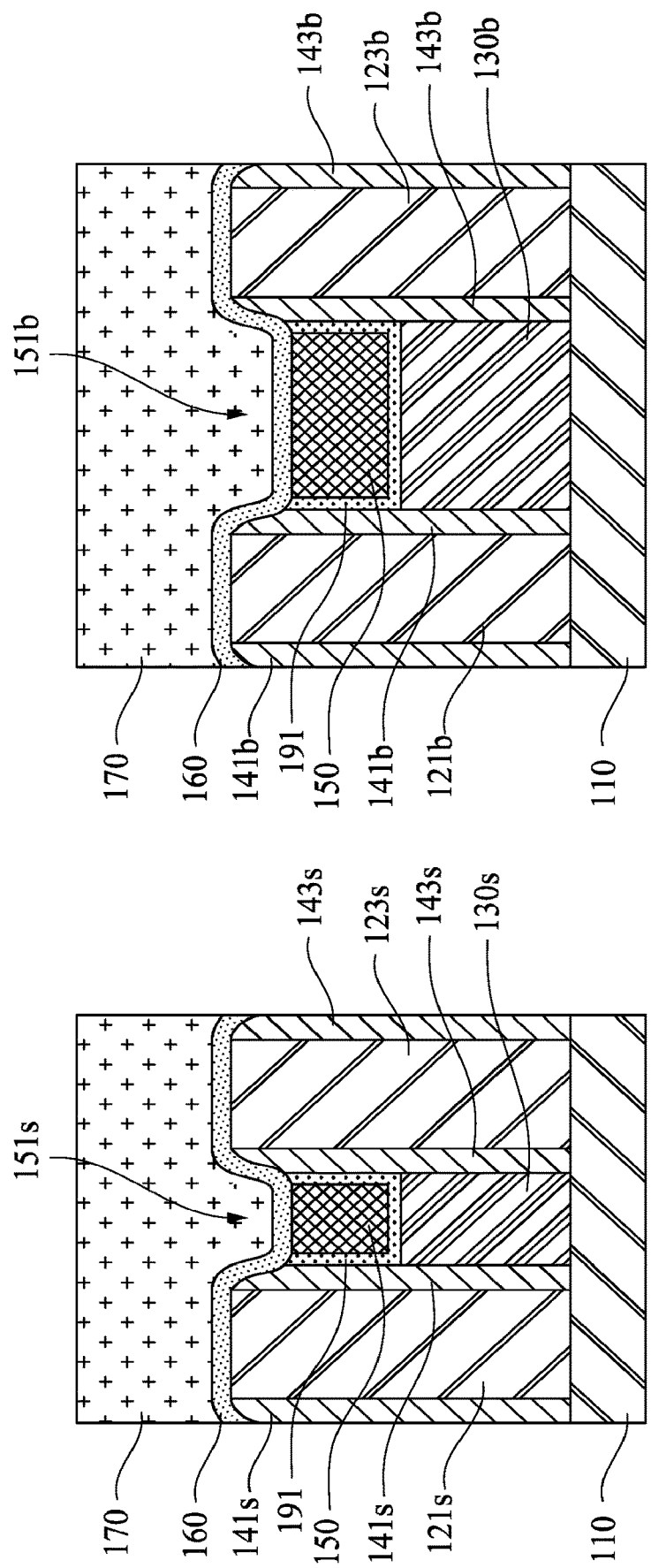

In FIG. 7, a dielectric layer 170 is formed on the protection layer 160. The dielectric layer 170 is an interlayer dielectric (ILD) layer. The dielectric layer 170 is made of a dielectric material, such as silicon oxide, silicon nitride, silicon oxynitride, or combinations thereof. In some embodiments, the dielectric layer 170 is made of a low-κ dielectric material to improve resistive-capacitive (RC) delay. In some embodiments, the low-κ dielectric material is, for example, hydrogenated carbon-doped silicon oxide (SiCOH), fluorosilicate glass (FSG), nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The dielectric layer 170 is formed by, for example, chemical vapor deposition (CVD), spin coating, or combinations thereof.

Figure 8:
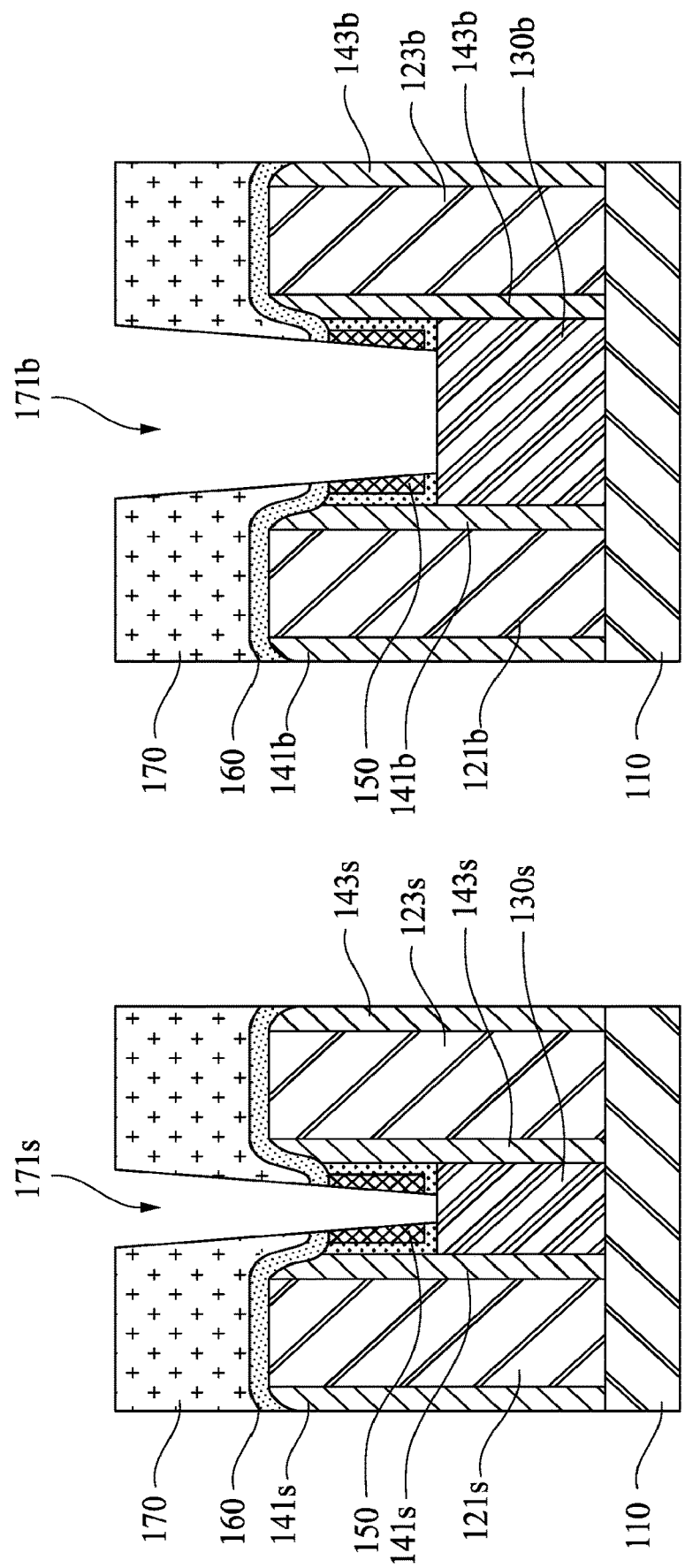

Reference is made to FIG. 7 and FIG. 8. A hole 171s is formed in the dielectric layers 150 and 170 to expose the source/drain structure 130s, and a portion of the protection layer 160 on the bottom surface of the recess 151s is removed when the hole 171s is formed. A hole 171b is formed in the dielectric layers 150 and 170 to expose the source/drain structure 130b, and a portion of the protection layer 160 on the bottom surface of the recess 151b is removed when the hole 171b is formed. At least portions of the protection layer 160 are exposed by the holes 171s and 171b. The holes 171s and 171b are formed by a photolithography and etching process. The photolithography and etching process includes photoresist application, exposure, developing, etching, and photoresist removal. A photoresist is applied onto the dielectric layer 170 by, for example, spin coating. The photoresist is then prebaked to drive off excess photoresist solvent. After prebaking, the photoresist is exposed to a pattern of intense light.

The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between the final lens of the exposure tool and the photoresist surface may be filled with a liquid medium that has a refractive index greater than one during the exposure to enhance the photolithography resolution. The exposure to light causes a chemical change that allows some of the photoresist soluble in a photographic developer.

Then, a post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist.

At least one portion of the dielectric layer 170 which is not protected by the remaining photoresist is etched to form the holes 171s and 171b. The etching of the dielectric layer 170 may be dry etching, such as reactive ion etching (RIE), plasma enhanced (PE) etching, or inductively coupled plasma (ICP) etching. In some embodiments, when the dielectric layer 170 is made of silicon oxide, fluorine-based RIE can be used to form the holes 171s and 171b. The gas etchant used to dry etch the dielectric layer 170 is, for example, $CF_4/O_2$.

After the holes 171s and 171b are formed, the photoresist is removed from the dielectric layer 170 by, for example, plasma ashing, stripping, or combinations thereof. Plasma ashing uses a plasma source to generate a monatomic reactive species, such as oxygen or fluorine. The reactive species combines with the photoresist to form ash which is removed with a vacuum pump. Stripping uses a photoresist stripper, such as acetone or a phenol solvent, to remove the photoresist from the dielectric layer 170.

In addition, after the holes 171s and 171b are formed, at least portions of the residual dielectric layer 150 are present on sidewalls of the holes 171s and 171b. Specifically, the portion of the residual dielectric layer 150 on the sidewall of the hole 171s is present on the spacers 141s and 143s on the sidewalls of the gate structures 121s and 123s, and the portion of the residual dielectric layer 150 on the sidewall of the hole 171b is present on the spacers 141b and 143b on the sidewalls of the gate structures 121b and 123b.

Figure 9:
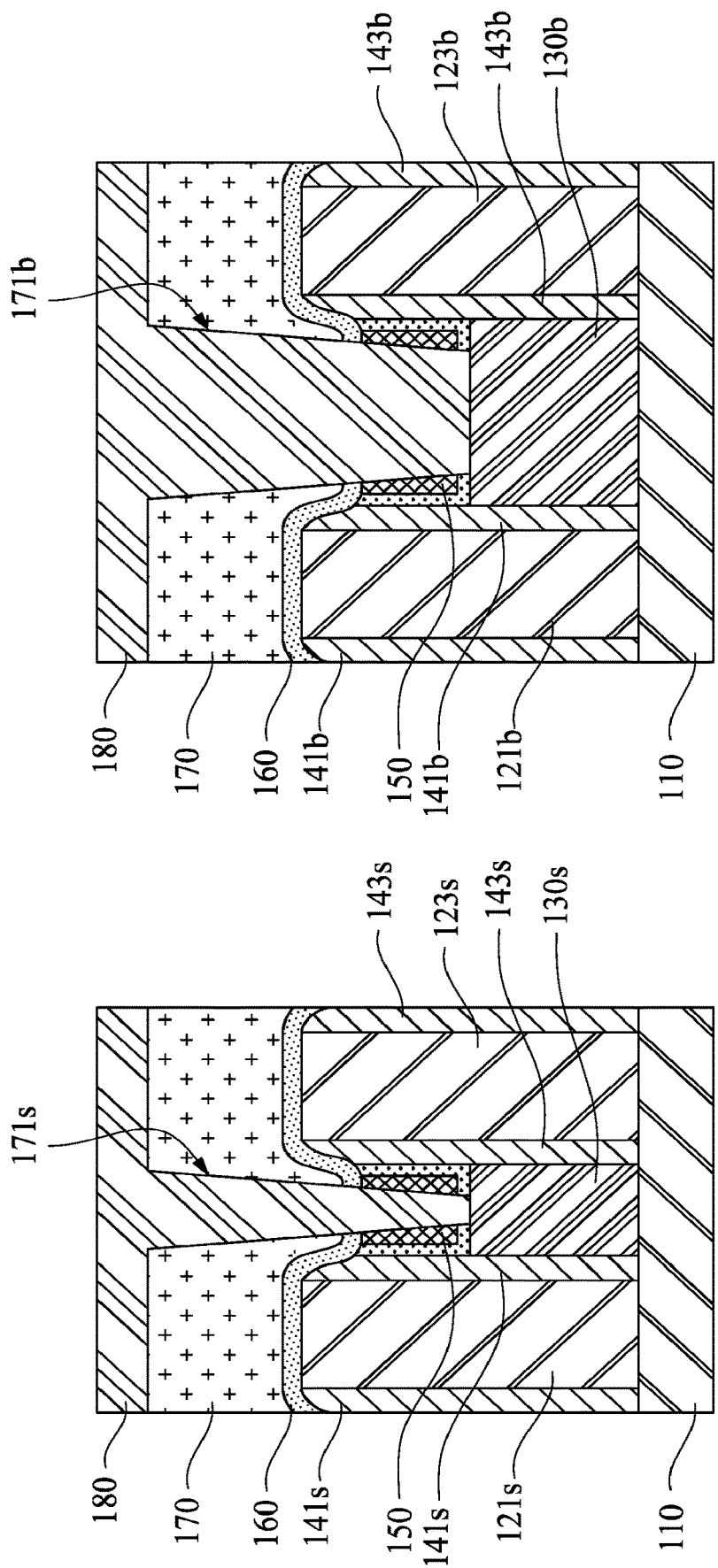

Reference is made to FIG. 9. A conductive layer 180 overfills the holes 171s and 171b. The conductive layer 180 is made of metal, such as copper (Cu), aluminum (Al), tungsten (W), nickel (Ni), cobalt (Co), titanium (Ti), platinum (Pt), tantalum (Ta), or combinations thereof. The conductive layer 180 is formed by, for example, electrochemical deposition, physical vapor deposition (PVD), chemical vapor deposition (CVD), or combinations thereof.

Figure 10:
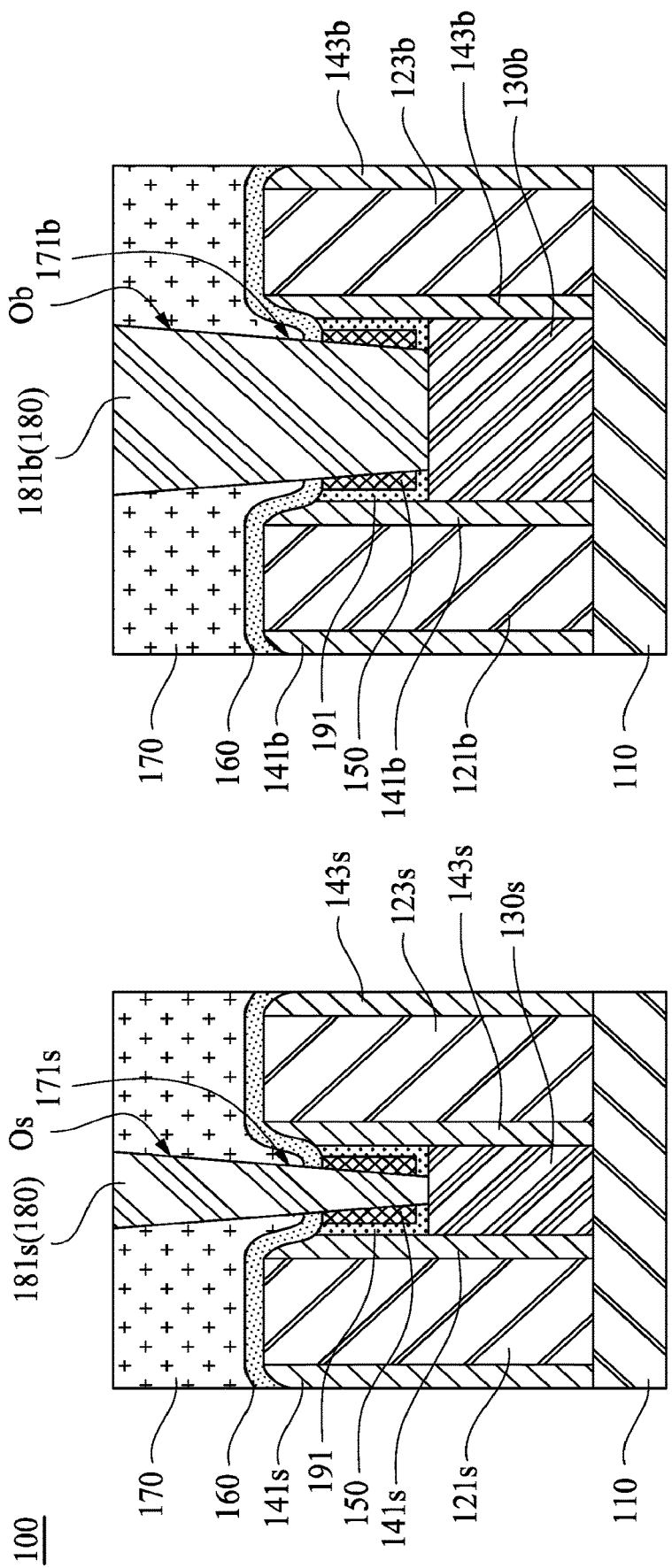

Then, as shown in FIG. 9 and FIG. 10, the excess conductive layer 180 outside of the holes 171s and 171b is removed. The excess conductive layer 180 outside of the holes 171s and 171b is removed through a removal process. In some embodiments, the conductive layer 180 over burden is removed by a chemical mechanical polishing (CMP) process. In some embodiments, when the conductive layer 180 is made of copper (Cu), the CMP slurry is made of, for example, a mixture of suspended abrasive particles, an oxidizer, and a corrosion inhibitor, and the CMP slurry is acidic. After the CMP process, a conductor 181s (the conductive layer 180) is formed in the hole 171s, and a conductor 181b (the conductive layer 180) is formed in the hole 171b. The conductor 181s is electrically connected to the source/drain structure 130s, and the conductor 181b is electrically connected to the source/drain structure 130b. A portion of the protection layer 160 is present between the conductor 181s and the spacer 141s and between the conductor 181s and the spacer 143s, and a portion of the protection layer 160 is present between the conductor 181b and the spacer 141b and between the conductor 181b and the spacer 143b.

In another aspect of the present disclosure, a semiconductor structure 100 is provided. The semiconductor structure 100 includes a substrate 110, gate structures 121s, 121b, 123s, and 123b, spacers 141s, 141b, 143s, and 143b, source/drain structures 130s and 130b, conductors 181s and 181b, and at least one protection layer 160. The gate structures 121s, 121b, 123s, and 123b are present on the substrate 110. The spacer 141s is present on at least one sidewall of the gate structure 121s, the spacer 143s is present on at least one sidewall of the gate structure 123s, the spacer 141b is present on at least one sidewall of the gate structure 121b, and the spacer 143b is present on at least one sidewall of the gate structure 123b.

The spacer 141s has a top portion and a bottom portion between the top portion and the substrate 110. The spacer 143s has a top portion and a bottom portion between the top portion and the substrate 110. The spacer 141b has a top portion and a bottom portion between the top portion and the substrate 110. The spacer 143b has a top portion and a bottom portion between the top portion and the substrate 110.

The source/drain structure 130s is present on the substrate 110 and adjacent to the bottom portions of the spacers 141s and 143s, and the source/drain structure 130s is present between the bottom portions of the spacers 141s and 143s. The source/drain structure 130b is present on the substrate 110 and adjacent to the bottom portions of the spacers 141b and 143b, and the source/drain structure 130b is present between the bottom portions of the spacers 141b and 143b. The conductor 181s is electrically connected to the source/drain structure 130s, and the conductor 181b is electrically connected to the source/drain structure 130b.

A portion of the protection layer 160 is present between the conductor 181s and the top portion of the spacer 141s and between the conductor 181s and the top portion of the spacer 143s and on the gate structures 121s and 123s, and a surface of the portion of the protection layer 160 facing the conductor 181s is an outwardly curved surface. A portion of the protection layer 160 is present between the conductor 181b and the top portion of the spacer 141b and between the conductor 181b and the top portion of the spacer 143b and on the gate structures 121b and 123b, and a surface of the portion of the protection layer 160 facing the conductor 181b is an outwardly curved surface.

The top portions of the spacers 141s and 143s have corner surfaces facing the protection layer 160 and the conductor 181s, and the corner surfaces have a radius of curvature in a range from about 1 to about 100. The top portions of the spacers 141b and 143b have corner surfaces facing the protection layer 160 and the conductor 181b, and the corner surfaces have a radius of curvature in a range from about 1 to about 200. In addition, the protection layer 160 is present between the corner surface of the top portion of the spacer 141s and the conductor 181s, between the corner surface of the top portion of the spacer 143s and the conductor 181s, between the corner surface of the top portion of the spacer 141b and the conductor 181b, and between the corner surface of the top portion of the spacer 143b and the conductor 181b.

The semiconductor structure 100 further includes a contact etch stop layer (CESL) 191. A portion of the CESL 191 is present between the conductor 181s and the bottom portion of the spacer 141s while absent between the portion of the protection layer 160 adjacent to the spacer 141s and the corner surface of the top portion of the spacer 141s. A portion of the CESL 191 is present between the conductor 181s and the bottom portion of the spacer 143s while absent between the portion of the protection layer 160 adjacent to the spacer 143s and the corner surface of the top portion of the spacer 143s. A portion of the CESL 191 is present between the conductor 181b and the bottom portion of the spacer 141b while absent between the portion of the protection layer 160 adjacent to the spacer 141b and the corner surface of the top portion of the spacer 141b. A portion of the CESL 191 is present between the conductor 181b and the bottom portion of the spacer 143b while absent between the portion of the protection layer 160 adjacent to the spacer 143b and the corner surface of the top portion of the spacer 143b.

Specifically, the protection layer 160 is made of a dielectric material, such as silicon nitride, silicon oxynitride, or combinations thereof. Embodiments of this disclosure are not limited thereto.

The semiconductor structure 100 further includes a dielectric layer 170. The dielectric layer 170 is present at least on the protection layer 160 and has openings Os and Ob at least therein. The source/drain structure 130s is exposed through the opening Os, and at least a portion of the conductor 181s is present in the opening Os. The source/drain structure 130b is exposed through the opening Ob, and at least a portion of the conductor 181b is present in the opening Ob. The conductor 181s is electrically connected to the source/drain structure 130s at least through the opening Os, and the conductor 181b is electrically connected to the source/drain structure 130b at least through the opening Ob. In addition, the protection layer 160 is absent in the openings Os and Ob of the dielectric layer 170, and the protection layer 160 is present between the dielectric layer 170 and the gate structure 121s, between the dielectric layer 170 and the gate structure 121b, between the dielectric layer 170 and the gate structure 123s, and between the dielectric layer 170 and the gate structure 123b.

The semiconductor structure 100 further includes a dielectric layer 150. A portion of the dielectric layer 150 is present between the conductor 181s and the spacer 141s, a portion of the dielectric layer 150 is present between the conductor 181s and the spacer 143s, a portion of the dielectric layer 150 is present between the conductor 181b and the spacer 141b, and a portion of the dielectric layer 150 is present between the conductor 181b and the spacer 143b. The protection layer 160 is present above the dielectric layer 150. That is, portions of the dielectric layer 150 is present between the protection layer 160 adjacent to the spacers 141s and 143s and the source/drain structure 130s, and portions of the dielectric layer 150 is present between the protection layer 160 adjacent to the spacers 141b and 143b and the source/drain structure 130b.

In some embodiments, the dielectric layers 150 and 170 are made of substantially the same material. In some embodiments, the protection layer 160 and the contact etch stop layer 191 are made of different materials.

The source/drain structure 130 may include at least one source/drain stressor. Embodiments of this disclosure are not limited thereto.

The protection layer 160 can protect the spacers 141s, 141b, 143s, and 143b from being over-etched during the forming the holes 171s and 171b. Therefore, after formation of the conductors 181s and 181b, the conductors 181s and 181b can be electrically isolated from the gate structures 121s, 121b, 123s, and 123b without causing short circuit failures and/or the leakage problem. With the protection layer 160, the device size can be further reduced without putting a heavy load on the photolithography and etching process, and thus the device performance can be improved. In addition, by corner rounding the spacers 141s, 141b, 143s, and 143b, the widths of the upper portions of the recesses 151s and 151b become greater, so it becomes easier to form the holes 171s and 171b. Therefore, the overlay and pattern loading requirements can be loosened, and the reliability and/or the yield in fabricating the semiconductor devices can be improved.

According to some embodiments of the present disclosure, a semiconductor structure includes a substrate, at least one first gate structure, at least one first spacer, at least one source/drain structure, at least one conductor, and a contact etch stop layer. The first gate structure is present on the substrate. The first spacer is present on at least one sidewall of the first gate structure, in which the first spacer has a top portion and a bottom portion between the top portion and the substrate. The source/drain structure is present adjacent to the bottom portion of the first spacer. The conductor is electrically connected to the source/drain structure. The protection layer is present at least between the conductor and the top portion of the first spacer. The contact etch stop layer is present at least partially between the conductor and the bottom portion of the first spacer while absent between the protection layer and the top portion of the first spacer.

According to some embodiments of the present disclosure, a semiconductor structure includes a substrate, at least one gate structure, at least one spacer, at least one source/drain structure, and at least one conductor. The gate structure is present on the substrate. The spacer is present on at least one sidewall of the gate structure. The source/drain structure is present on the substrate. The conductor is electrically connected to the source/drain structure, in which the spacer has a top corner surface facing the conductor, and the top corner surface has a radius of curvature in a range from about 1 to about 200.

According to some embodiments of the present disclosure, a method for manufacturing a semiconductor structure includes the following operations. A dielectric layer is formed on at least one source/drain structure adjacent to at least one spacer of at least one gate structure. An upper portion of the first dielectric layer is removed, such that the first dielectric layer and the spacer of the gate structure form a recess. A top portion of the spacer adjacent to the recess is rounded to be a rounded top corner. A protection layer is formed at least on the rounded top corner. A conductive via is formed at least through the dielectric layer to be electrically connected to the source/drain structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, the method comprising:
   forming a first dielectric layer over a source/drain structure adjacent to a first spacer of a gate structure;
   removing an upper portion of the first dielectric layer, such that the first dielectric layer and the first spacer of the gate structure form a recess;
   rounding a top portion of the first spacer adjacent to the recess to have a rounded top corner after the removing an upper portion of the first dielectric layer;
   forming a protection layer at least on the rounded top corner and over the gate structure;
   forming a second dielectric layer over the protection layer, wherein the second dielectric layer is spaced apart from the gate structure by the protection layer; and
   forming a conductive via at least through the first dielectric layer to be electrically connected to the source/drain structure.

2. The method of claim 1, further comprising:
   forming a contact etch stop layer at least on a sidewall of the top portion of the first spacer before the forming a first dielectric layer.

3. The method of claim 2, wherein the forming a contact etch stop layer comprises forming a portion of the contact etch stop layer over the source/drain structure.

4. The method of claim 2, wherein the rounding a top portion of the first spacer removes at least a portion of the contact etch stop layer from the sidewall of the top portion of the first spacer.

5. The method of claim 2, wherein the contact etch stop layer and the protection layer are made of different materials.

6. The method of claim 1, wherein the forming a protection layer comprises forming a portion of the protection layer over the first dielectric layer.

7. The method of claim 6, wherein the forming a conductive via comprises:
   forming a hole at least through the portion of the protection layer over the first dielectric layer to expose a portion of the source/drain structure; and
   forming a conductor in the hole and electrically connected to the exposed portion of the source/drain structure.

8. The method of claim 1, wherein:
   the forming a second dielectric layer comprises forming the second dielectric layer before the forming a conductive via, wherein the first dielectric layer is spaced apart from the second dielectric layer by the protection layer.

9. The method of claim 1, wherein:
   a second spacer is disposed diametrically opposite the gate structure relative to the first spacer, and
   the rounding a top portion of the first spacer comprises varying a cross-sectional profile of the first spacer relative to a cross-sectional profile of the second spacer.

10. The method of claim 1, wherein the forming a conductive via comprises forming the conductive via at least through the second dielectric layer.

11. A method for manufacturing a semiconductor structure, the method comprising:
    forming a first dielectric layer over a source/drain structure adjacent to a first spacer of a gate structure;
    removing an upper portion of the first dielectric layer, such that the first dielectric layer and the first spacer of the gate structure form a recess;
    rounding a top portion of the first spacer adjacent to the recess to have a rounded top corner after the removing an upper portion of the first dielectric layer;
    forming a protection layer at least on the rounded top corner;
    forming a second dielectric layer over the protection layer, wherein the first dielectric layer is spaced apart from the second dielectric layer by the protection layer; and
    forming a conductive via at least through the first dielectric layer to be electrically connected to the source/drain structure after the forming a second dielectric layer.

12. The method of claim 11, wherein the forming a conductive via comprises forming the conductive via at least through the second dielectric layer.

13. The method of claim 11, wherein:
    a second spacer is disposed diametrically opposite the gate structure relative to the first spacer, and
    the rounding a top portion of the first spacer comprises varying a cross-sectional profile of the first spacer relative to a cross-sectional profile of the second spacer.

14. The method of claim 11, further comprising:
forming a contact etch stop layer at least on a sidewall of the top portion of the first spacer before the forming a first dielectric layer.

15. The method of claim 11, wherein the forming a conductive via comprises:
forming a hole at least through the second dielectric layer, the protection layer, and the first dielectric layer to expose a portion of the source/drain structure; and
forming a conductor in the hole and electrically connected to the exposed portion of the source/drain structure.

16. A method for manufacturing a semiconductor structure, the method comprising:
forming a first dielectric layer over a source/drain structure adjacent to a first spacer of a gate structure, wherein a second spacer is disposed diametrically opposite the gate structure relative to the first spacer;
removing an upper portion of the first dielectric layer, such that the first dielectric layer and the first spacer of the gate structure form a recess;
rounding a top portion of the first spacer adjacent to the recess to have a rounded top corner after the removing an upper portion of the first dielectric layer, wherein the rounding a top portion of the first spacer comprises varying a cross-sectional profile of the first spacer relative to a cross-sectional profile of the second spacer;
forming a protection layer at least on the rounded top corner; and
forming a conductive via at least through the first dielectric layer to be electrically connected to the source/drain structure.

17. The method of claim 16, further comprising:
forming a second dielectric layer over the protection layer before the forming a conductive via, wherein the first dielectric layer is spaced apart from the second dielectric layer by the protection layer.

18. The method of claim 16, wherein the forming a protection layer comprises forming a portion of the protection layer over the first dielectric layer.

19. The method of claim 18, wherein the forming a conductive via comprises:
forming a hole at least through the portion of the protection layer over the first dielectric layer to expose a portion of the source/drain structure; and
forming a conductor in the hole and electrically connected to the exposed portion of the source/drain structure.

20. The method of claim 16, further comprising:
forming a contact etch stop layer at least on a sidewall of the top portion of the first spacer before the forming a first dielectric layer.

* * * * *